United States Patent

Lukes et al.

[11] Patent Number: 5,903,195
[45] Date of Patent: May 11, 1999

[54] AUTOMATICALLY RANGING PHASE LOCKED LOOP CIRCUIT FOR MICROPROCESSOR CLOCK GENERATION

[75] Inventors: Eric John Lukes; James David Strom; Dana Marie Woeste, all of Rochester, Minn.

[73] Assignee: International Business Machines Corporation, Armonk, N.Y.

[21] Appl. No.: 09/016,848

[22] Filed: Jan. 30, 1998

[51] Int. Cl.$^6$ .............................. H03L 7/12; H03L 7/095
[52] U.S. Cl. .................... 331/4; 331/8; 331/17; 331/57; 331/179; 331/DIG. 2; 327/156
[58] Field of Search ................... 331/1 A, 4, 8, 331/10, 11, 14, 17, 25, 57, 179, DIG. 2; 327/156–159

[56] References Cited

U.S. PATENT DOCUMENTS

| | | | |
|---|---|---|---|
| 5,349,311 | 9/1994 | Mentzer | 331/57 |
| 5,389,898 | 2/1995 | Taketoshi et al. | 331/2 |
| 5,477,198 | 12/1995 | Anderson et al. | 331/177 R |
| 5,686,864 | 11/1997 | Martin et al. | 331/1 A |
| 5,757,240 | 5/1998 | Boerstler et al. | 331/34 |
| 5,777,520 | 7/1998 | Kawakami | 331/1 R |

OTHER PUBLICATIONS

Barret, W.M., "Automatic Detection of Oscillator Frequency Drift", Research Disclosure, Dec. 1992, No. 344, Kenneth Mason Publications Ltd, England.

*Primary Examiner*—David Mis
*Attorney, Agent, or Firm*—Joan Pennington

[57] ABSTRACT

An improved phase locked loop (PLL) circuit is provided for use in microprocessor clock generation. A ring oscillator provides an output frequency signal. A voltage to current converter converts differential control voltages to a variable reference current applied to the ring oscillator. A range control reference current generator applies a range control reference current to the ring oscillator. A range control operatively controls the range control reference current generator to sequentially change the range control reference current applied to the ring oscillator. A lock detector coupled to the range control compares the output frequency signal and a reference frequency signal and responsive to the compares signals applies a locked signal to the range control. Responsive to an applied locked signal, the range control stops changing ranges. The phase locked loop (PLL) circuit automatically sweeps through multiple frequency subranges responsive to the range control. A control signal is applied to the voltage to current converter for selectively controlling an operational mode of the voltage to current converter from a squelched operational mode to an unsquelched operational mode after a set time period. This control signal also is applied to the range control, so that the range control stops changing ranges.

11 Claims, 8 Drawing Sheets

AUTOMATICALLY RANGING PHASE LOCKED LOOP CIRCUIT FOR MICROPROCESSOR CLOCK GENERATION

RELATED APPLICATION

The present invention relates to U.S. patent application Ser. No. 08/826,436 filed Mar. 18, 1997, by Eric J. Lukes and James D. Strom, entitled DIFFERENTIAL CHARGE PUMP FOR PHASE LOCKED LOOP CIRCUITS (R0996-155) and assigned to the present assignee. The subject matter of the above identified patent application is incorporated herein by reference.

FIELD OF THE INVENTION

The present invention generally relates phase locked loop circuits, and more particularly to, an automatically ranging phase locked loop (PLL) circuit for microprocessor clock generation.

DESCRIPTION OF THE RELATED ART

Phase locked loop (PLL) circuits are widely used in many different applications. Microprocessors require on-chip clock generation. When implementing a PLL on a CMOS microprocessor or other logic chip, a wide range of process variation can occur. This requires that the range of a voltage controlled oscillator (VCO) to be large to cover the whole range of operation of the PLL. Increasing the gain of the VCO to cover this process variation is undesirable, since it would also increase the sensitivity of the PLL to noise, causing increased jitter and decreased performance.

A need exists for an improved phase locked loop (PLL) circuit for microprocessor clock generation. A need exists for an improved phase locked loop (PLL) circuit including a mechanism for automatically selecting a VCO range. A need exists for such an improved phase locked loop (PLL) circuit that minimizes VCO gain (Mhz/V).

SUMMARY OF THE INVENTION

A principal object of the present invention is to provide a phase locked loop (PLL) circuit for microprocessor clock generation that provides efficient and effective performance. Other important objects are to provide such an improved phase locked loop (PLL) circuit for microprocessor clock generation substantially without negative effects and that overcomes many of the disadvantages of prior art arrangements.

In brief, an improved phase locked loop (PLL) circuit is provided for use in microprocessor clock generation. A ring oscillator provides an output frequency signal. A voltage to current converter converts differential control voltages to a variable reference current applied to the ring oscillator. A range control reference current generator applies a range control reference current to the ring oscillator. A range control operatively controls the range control reference current generator for sequentially adjusting the range control reference current applied to the ring oscillator. A lock detector coupled to the range control compares the output frequency signal and a reference frequency signal and responsive to the compares signals applies a locked signal to the range control. Responsive to an applied locked signal, the range control stops changing ranges.

In accordance with feature of the invention, the phase locked loop (PLL) circuit automatically sweeps through multiple frequency subranges responsive to the range control. A control signal is applied to the voltage to current converter for selectively controlling operational mode of the voltage to current converter from a squelched operational mode to an unsquelched operational mode after a set time period. This control signal also is applied to the range control, so that the range control stops changing ranges.

BRIEF DESCRIPTION OF THE DRAWING

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
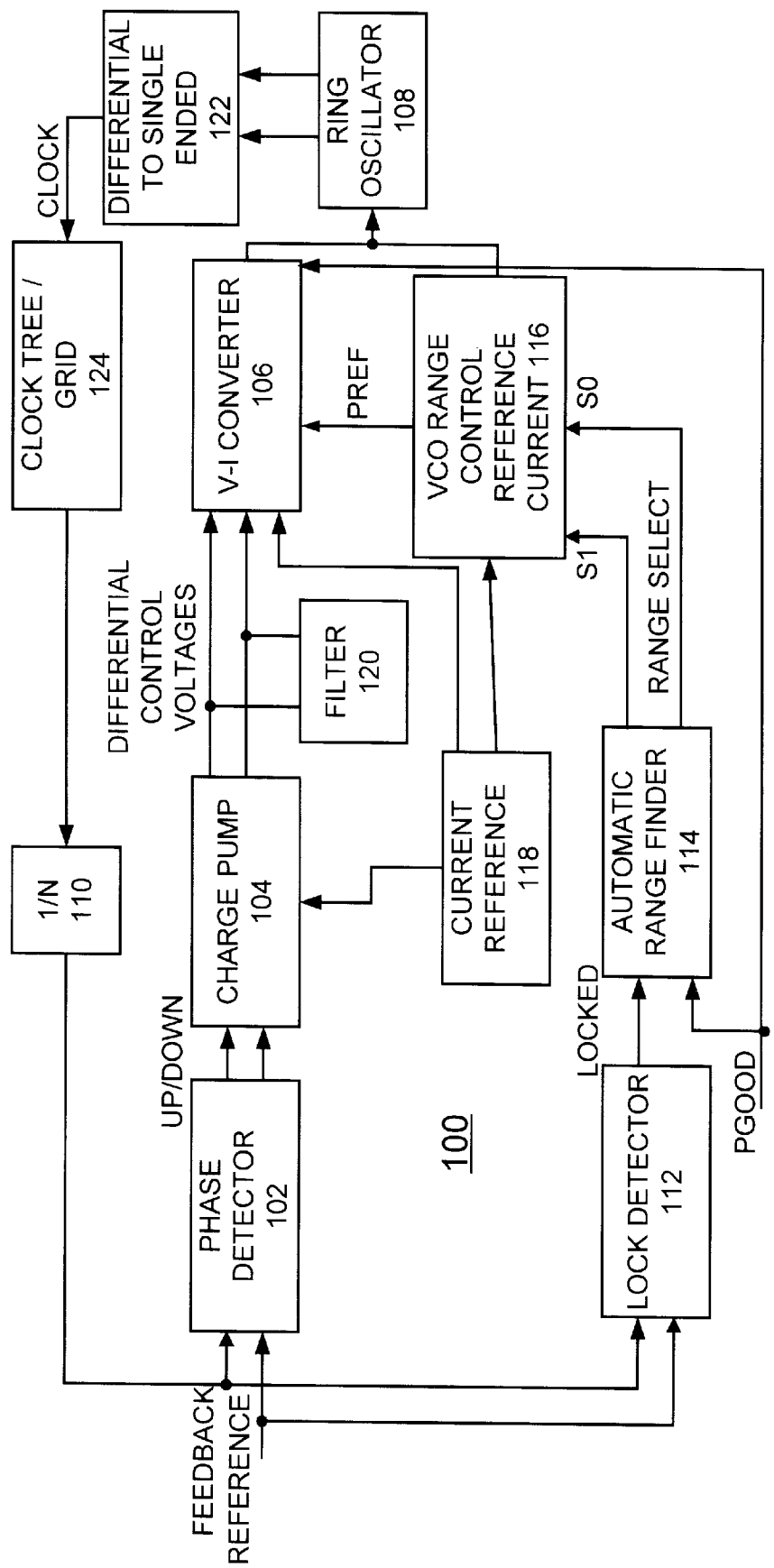
FIG. 1 is a schematic and block diagram representation of a phase locked loop (PLL) circuit of the preferred embodiment.

Having reference now to FIG. 1, there is shown a phase locked loop (PLL) circuit generally designated by the reference character 100 and arranged in accordance with the present invention. The phase locked loop (PLL) circuit 100 includes a phase detector 102 providing an UP/DOWN control signal to a charge pump 104 responsive to applied FEEDBACK and REFERENCE signals. The phase locked loop (PLL) circuit 100 includes a voltage to current (V-I) converter 106, a ring oscillator 108, a 1/N divider 110, a lock detector 112, and a range finder 114. The FEEDBACK and REFERENCE signals also are applied to the lock detector 112 which compares the frequency of the two signals and sets a lock bit when these signals are within a set percentage apart. This lock bit is sent to the automatic range finder 114.

The phase locked loop (PLL) circuit 100 includes a VCO range control reference current 116 automatically providing a reference current input to the a ring oscillator 108 for each of multiple frequency ranges. The phase locked loop (PLL) circuit 100 includes a current reference 118 which can be a typical band-gap reference, providing currents for the charge pump 104, V-I converter 106, and the VCO range control reference current 116. The phase locked loop (PLL) circuit 100 includes a differential filter 120 coupled between the charge pump 104 and the V-I converter 106. PLL circuit 100 in the preferred embodiment is formed by complementary metal oxide semiconductor (CMOS) devices.

In accordance with features of the invention, the PLL 100 maintains a low VCO gain over process variation and operating frequency range. For example, the VCO frequency gain is reduced from 800 MHz/V to 200 MHz/V utilizing multiple automatically selected VCO ranges of the invention. The resulting improvements include better jitter performance and a wider lock range over process. PLL 100 provides a simple, straight forward method of automatically selecting a VCO range that contains the frequency necessary for the PLL to lock. PLL 100 provides a wide operating frequency range with reduced control voltage to VCO frequency gain. As a result of the reduced gain VCO, PLL 100 provides a reduced noise sensitivity. PLL 100 automatically sweeps through each consecutive subrange provided by the automatic range finder 114 until the PLL 100 locks on to the correct frequency. The subrange provided by the automatic range finder 114 is not allowed to change after a "power good" PGOOD signal arrives, while the subrange widens to prevent loss of lock due to temperature and power supply variation for example, when the lock frequency is at the edge of the subrange. Changing from a squelched operational mode to an unsquelched operational mode of the V-I converter 106 provides this range widening function of PLL 100.

Figure 2:
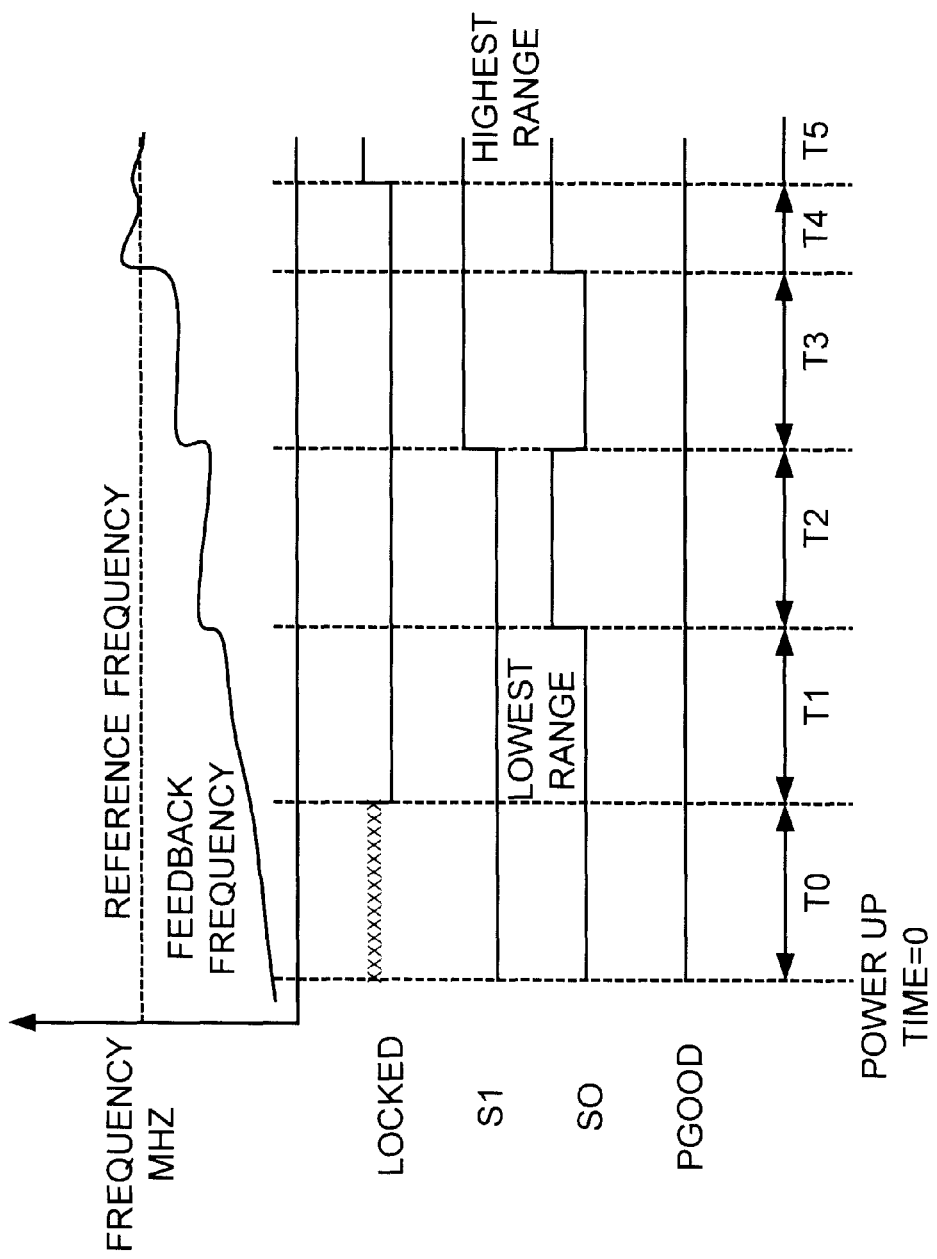
FIG. 2 is a timing diagram chart illustrating control signals of the phase locked loop (PLL) circuit of FIG. 1 of the preferred embodiment.

Referring also to FIG. 2, the phase detector 102 compares a reference clock signal at a line labeled REFERENCE to a feedback clock signal at a line labeled FEEDBACK. The phase detector 102 sends up/down pulses to the charge pump 104 corresponding to the need for the VCO to speed up with the FEEDBACK signal too slow or to slow down with the FEEDBACK signal too fast. The differential charge pump 104 converts these pulses to discrete amounts of charge applied to or taken from filter 120 which creates the differential control voltages applied to the V-I converter 106.

The range select bits S0, S1 from the automatic range finder 114 set the reference current in the VCO range control reference current 116. A base current is set with both S1, S0 set to zero for a lowest 00 range. As the range bits increase 01, 10, 11, an incremental current is added to this base current for each automatically selected higher range. This total current from the VCO range control reference current 116 is added to the current from the V-I converter 106. The sum is then referenced by the ring oscillator 108.

The more current supplied from the sources 106 and 116, the faster the ring oscillator 108 oscillates. The differential output of the ring oscillator 108 is converted to a single ended rail-rail signal by the Differential To Single Ended converter 122. This rail to rail clock signal output of converter 122 is distributed throughout an associated processor (not shown) with a clock tree/grid 124. One of the distributed clock paths is fed back through a divide by N counter 110. The 1/N divided signal returns to the phase detector 102 and lock detector 112 and is compared to the REFERENCE clock.

Figure 3:
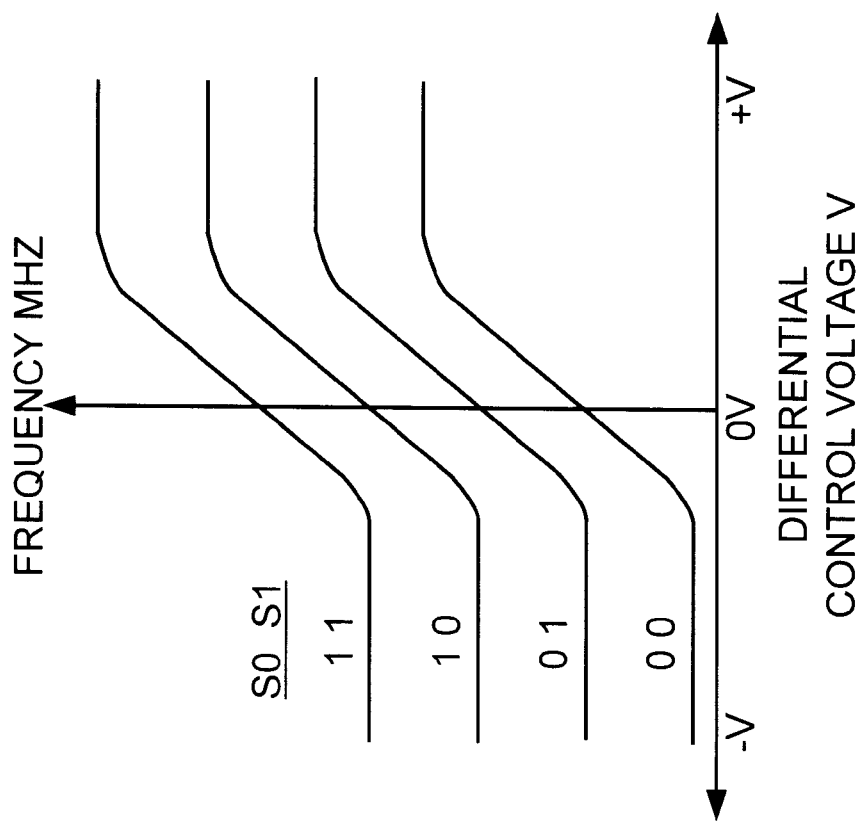
FIG. 3 is a chart illustrating multiple ranges of differential control voltage signals relative to frequency of the phase locked loop (PLL) circuit of FIG. 1 of the preferred embodiment.

FIG. 3 illustrates multiple subranges 00, 01, 10, 11 of differential control voltage signals relative to frequency of the phase locked loop (PLL) circuit 100

Figure 4:
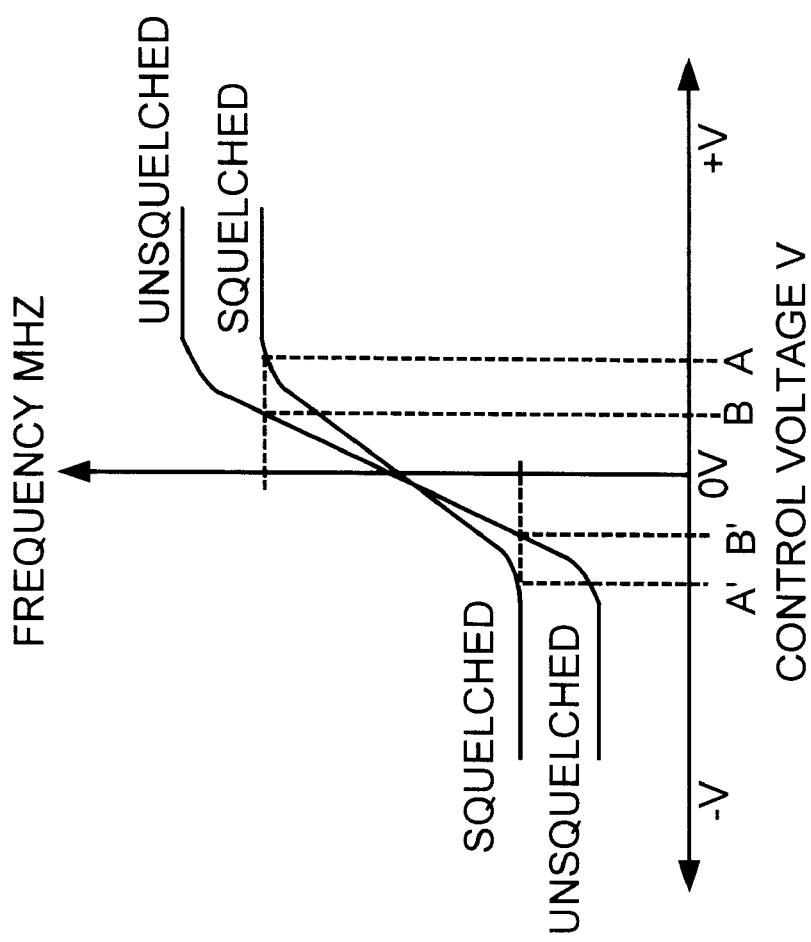
FIG. 4 is a chart illustrating differential control voltage signals relative to frequency provided by squelched and unsquelched operational modes of a voltage-to-current (V-I) converter of the phase locked loop (PLL) circuit of FIG. 1 of the preferred embodiment.
Figure 5A:
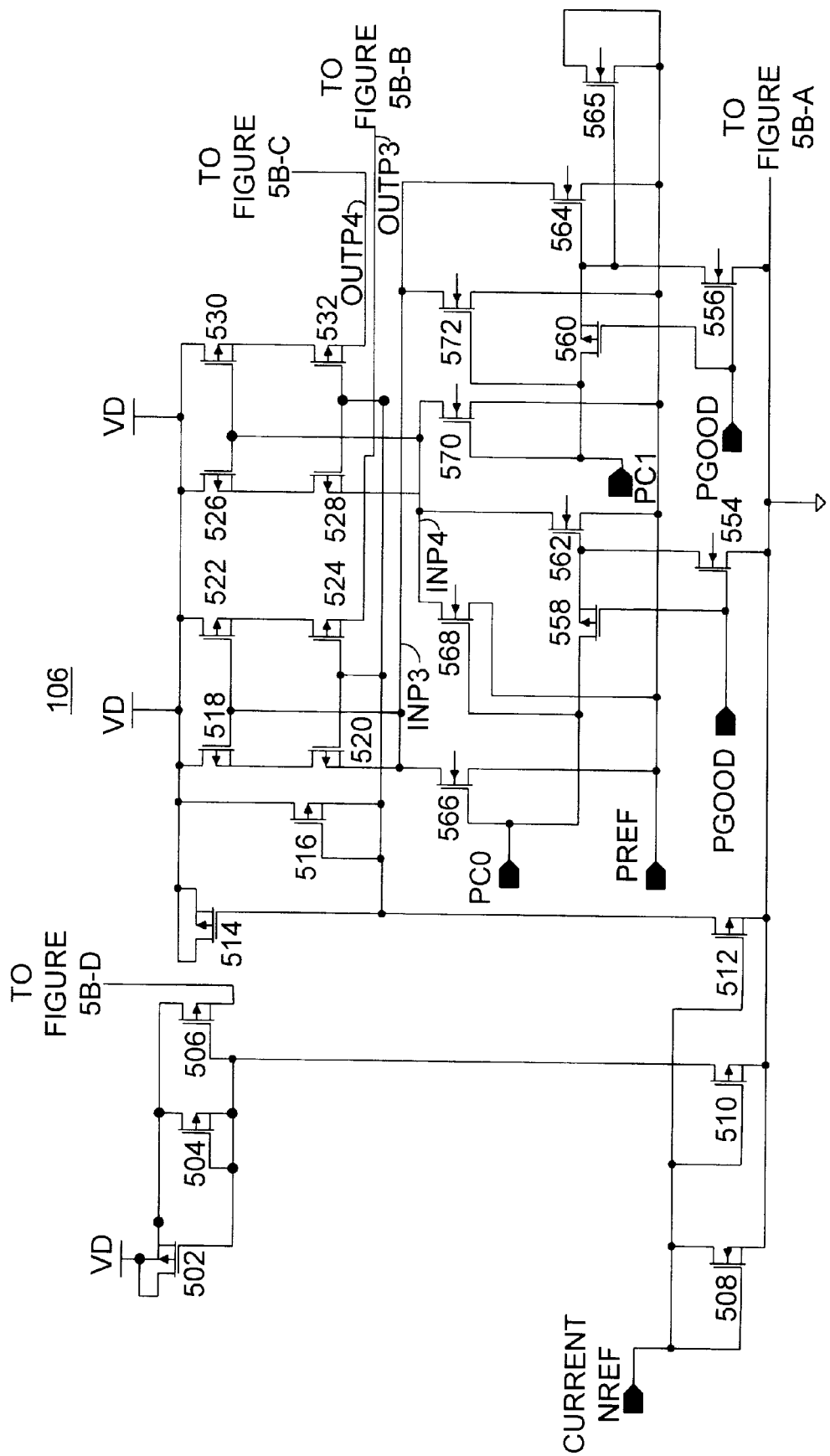
FIGS. 5A and 5B together provide a schematic diagram representation of a voltage-to-current (V-I) converter of the phase locked loop (PLL) circuit of FIG. 1 of the preferred embodiment.
Figure 5B:
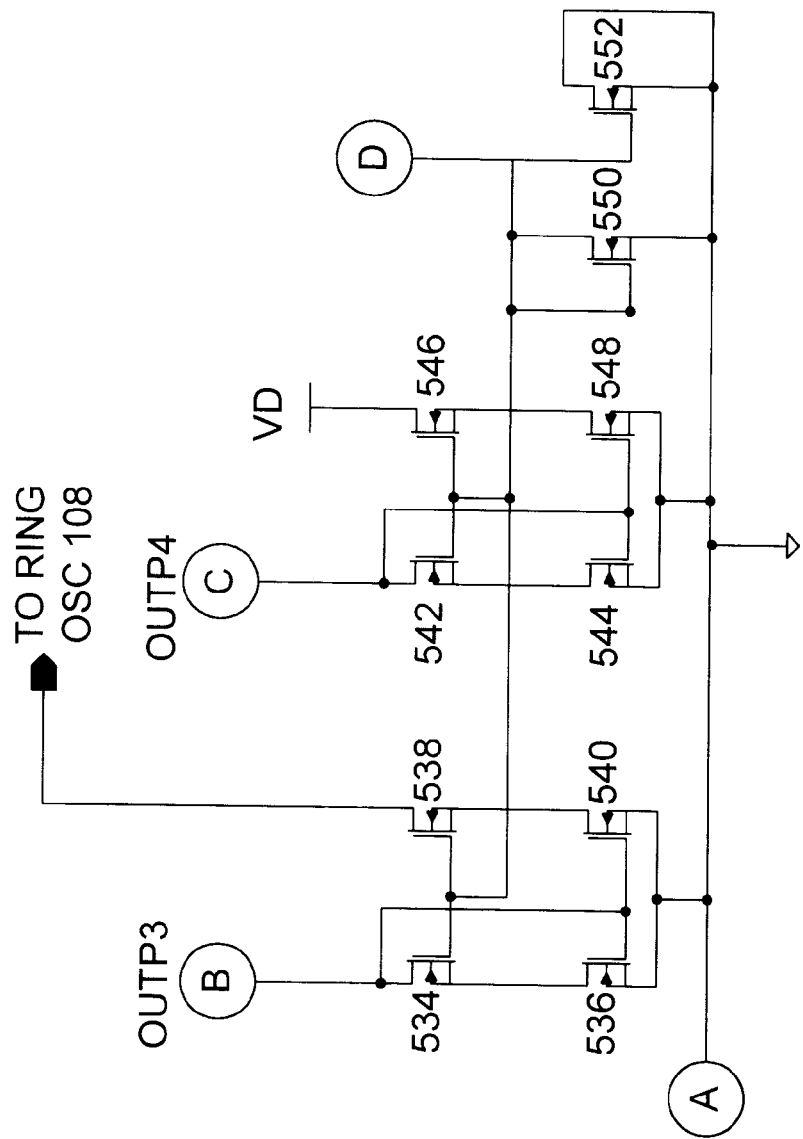

Having reference also to FIGS. 4, 5A and 5B, the V-I converter 106 converts the differential control voltages into a variable reference current for the ring oscillator 108. FIG. 4 illustrates differential control voltage signals relative to frequency provided by squelched and unsquelched operational modes of a voltage-to-current (V-I) converter 106. V-I converter 106 includes current references, current mirrors and voltage-to-current function including P-channel and N-channel metal oxide semiconductor (NMOS) devices, as shown in FIGS. 5A and 5B.

Referring to FIGS. 5A and 5B, the V-I converter current references include P-channel field effect transistors (PFETs) 502, 504, 506 and N-channel field effect transistors (NFETs) 508, 510, and 512. V-I converter differential current mirrors include PFETs 514, 516, 518, 520, 524, 526, 528, 530, 532 and NFETs 534, 536, 538, 540, 542, 544, 546, 548, 550, and 552. V-I converter 106 includes operational modes control NFETs 554 and 556 and PFETs 558 and 560 for controlling the squelched and unsquelched operations of the V-I converter 106. Voltage to current function includes NFETs 562, 564 and 565 connected to the operational modes control NFETs 554 and 556 and PFETs 558 and 560 and connected to NFETs 566, 568, 570, 572. The NFETs 564, 566, 572 are connected to the gates of PFETs 518 and 522 and to the drain of PFET 520 at line INP3. The NFETs 568, 570 are connected to the gates of PFETs 526 and 530 and to the drain of PFET 528 at line INP4. The differential control voltages at inputs PC0 and PC1 respectively are applied to the gates of NFETs 566 and 568 and the gates of NFETs 570 and 572. A PGOOD signal is applied to the gates of the operational modes control NFETs 554 and 556 and PFETs 558 and 560 which turns off NFETs 562 and 564 with the PGOOD signal active.

The V-I converter 106 operates in a squelched or reduced gain, current limited mode with the PGOOD signal inactive during lock acquisition, where the part of the reference current is redirected so that the frequency gain of the VCO is reduced with NFETs 562 and 564 off. When the PGOOD signal arrives, the squelch operational mode of the converter 106 is turned off, changing to an unsquelched or increased gain expanded current operational mode and increasing the VCO gain with NFETs 562 and 564 turned on. This unsquelched state will cause the PLL loop 100 temporarily unlock, then the control voltage differential is reduced in order to return to the locked frequency. In the unsquelched state, the V-I converter 106 provides a wider frequency range. This prevents the PLL circuit 100 from losing lock, for example, for the cases where temperature and power supply variations cause a change in V-I converter 106. For example, the PLL circuit 100 were to lock onto the frequency corresponding to A in FIG. 4, and then temperature and/or power supply variations would require the VCO to try to run faster which would not be possible. With the increased unsquelched range after lock, if the PLL circuit 100 locked onto the frequency corresponding to A again, the PGOOD signal would cause the PLL to relock at control voltage point B with the reduced control voltage. Now supply and temperature variations can be tracked, and lock of the PLL circuit 100 should not be lost.

Figure 6:
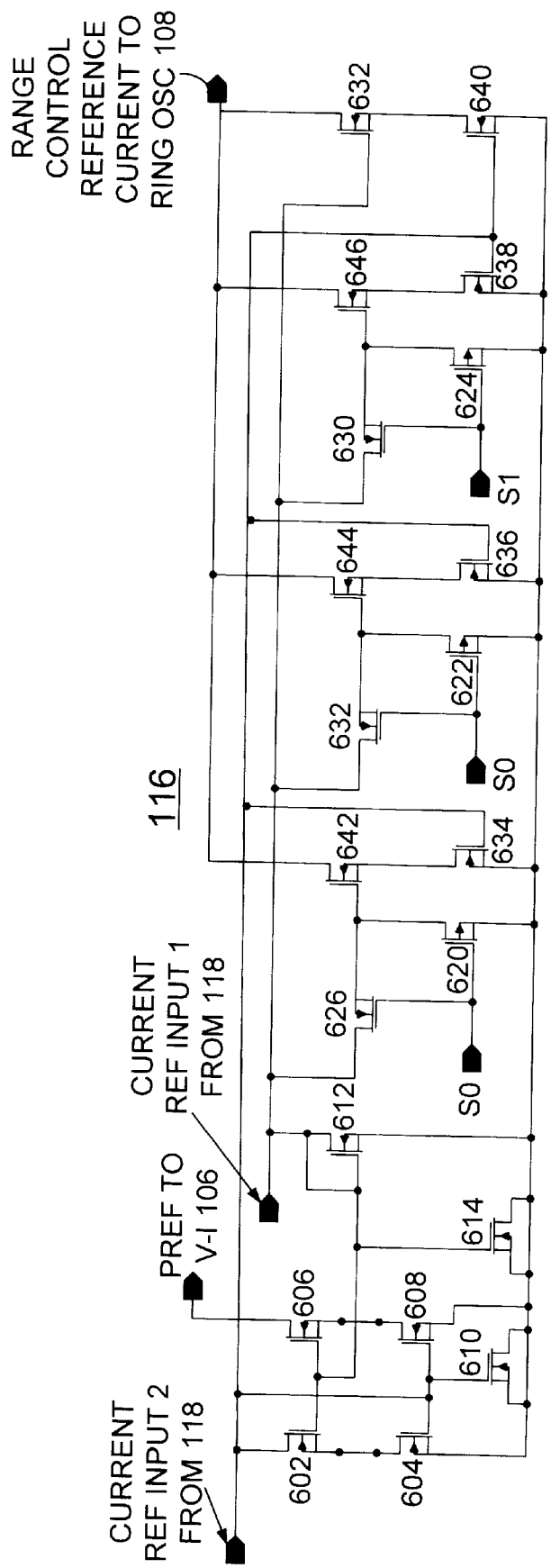
FIG. 6 is a schematic diagram representation of a VCO reference of the phase locked loop (PLL) circuit of FIG. 1 of the preferred embodiment.

Referring to FIG. 6, the VCO range control reference current 116 includes inputs from the current reference 118 at inputs labeled CURRENT REF INPUT FROM 118 applied to current mirror NFETs 602, 604, 608, 610, 612 and 614. NFET 606 provides the PREF input to the V-I converter 106 at output labeled PREF TO V-I 106. The So range control bit is applied to the gate of a PFET 620 and the S1 range control bit is applied to the gates of a PFETs 622 and 624. Inputs from the current reference 118 at inputs labeled CURRENT REF INPUT 1 FROM 118 and CURRENT REF INPUT 2 FROM 118 are applied respectively to NFETs 626, 628, 630, 632 and NFETs 634, 636, 638, 640. A base range control reference current applied to ring oscillator at output labeled RANGE CONTROL REFERENCE CURRENT TO RING OSCILLATOR 108 is provided by NFETs 632 and 640 which are always on. An active S0 input turns on NFET 642 through NFET 620 providing two times the base range control reference current applied to ring oscillator 108. An active S1 input turns on NFETs 644 and 646 through respective NFETs 622, 624 providing three times the base range control reference current applied to ring oscillator 108. With both S0, S1 range control bits active, four times the base range control reference current is applied to ring oscillator 108.

The automatic range finder 114 can include a series of counters for providing the two bit range selector bits S0, S1 to the VCO range control reference current 116. The counters of automatic range finder 114 count for a set period of time, long enough for the charge pump 104 to traverse from the lowest control voltage possible through the highest control voltage possible (or vice versa), then change to the next consecutive higher range and begin to count again. When the PLL circuit 100 locks on, and the lock detector 112 sets the locked bit, the range finder 114 stops changing ranges and remains in the current range where lock occurred. If the range finder 114 reaches the end of the highest range (11), range finder 114 resets the count bits to the lowest range (00) and continues counting and changing ranges until a lock signal is received. The range finder 114 also stops changing ranges when the PGOOD signal is received. This PGOOD signal is a time control signal applied after a predetermined time period when the PLL circuit 100 should be locked and keeps the range finder 114 from changing ranges again, even if lock is lost. This is a safety precaution for possible noisy conditions where frequency drift could otherwise cause the range finder 114 to incorrectly change ranges.

Figure 7:
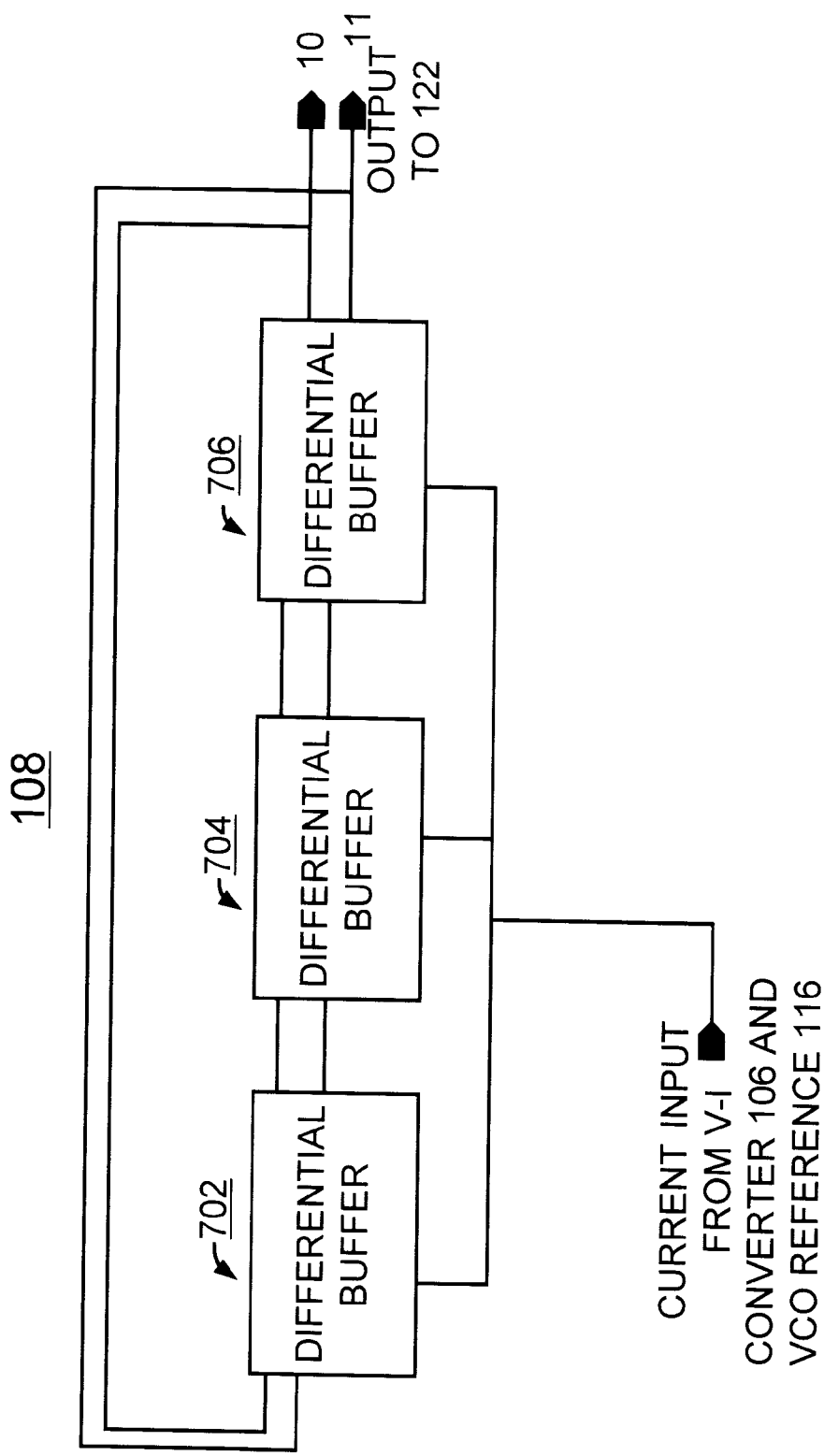
FIG. 7 is a schematic diagram representation of a ring oscillator of the phase locked loop (PLL) circuit of FIG. 1 of the preferred embodiment.

Referring to FIG. 7, the ring oscillator 108 includes a series of three differential buffers 702, 704, and 706 connected in a loop, as shown. Each of the buffers 702, 704, and 706 is referenced with a current source coming from the VCO range control reference current 116 and the V-I converter 106.

Using the multiple oscillator ranges with the automatic range finder 114 in this way, the gain of the V-I converter 106 is smaller while the capture range of the PLL circuit 100 remains wide. The smaller gain keeps the noise induced jitter lower. This method also does not require any external setting or changing of ranges, which keeps the number of connections external to the PLL smaller.

While the present invention has been described with reference to the details of the embodiments of the invention shown in the drawing, these details are not intended to limit the scope of the invention as claimed in the appended claims.

What is claimed is:

1. A phase locked loop (PLL) circuit for use in microprocessor clock generation comprising:

ring oscillator means for providing an output frequency signal;

voltage to current means coupled to said ring oscillator means for converting control voltages to a variable reference current;

range control reference current means coupled to said ring oscillator means for applying a range control reference current to said ring oscillator means;

range control means coupled to said range control reference current means for operatively controlling said range control reference current means for sequentially changing said range control reference current applied to said ring oscillator means; and lock detector means coupled to said range control means for comparing said output frequency signal and a reference frequency signal and for applying a locked signal to said range control means, and said range control means being responsive to an applied locked signal to stop changing ranges.

2. A phase locked loop (PLL) circuit as recited in claim 1 further includes control signal means coupled to said voltage to current means for selectively controlling an operational mode of said voltage to current means from a squelched operational mode to an unsquelched operational mode.

3. A phase locked loop (PLL) circuit as recited in claim 2 wherein said control signal means is coupled to said range control means to stop said sequentially changing said range control reference current.

4. A phase locked loop (PLL) circuit as recited in claim 2 wherein said control signal means is a time control signal applied after a predetermined time period.

5. A phase locked loop (PLL) circuit as recited in claim 1 wherein said range control reference current means coupled to said ring oscillator means for applying said range control reference current to said ring oscillator means applies a base range control reference current at a lowest subrange and applies an incremental current added to said base range control reference current for a next subrange.

6. A phase locked loop (PLL) circuit as recited in claim 1 wherein said range control reference current means coupled to said ring oscillator means for applying said range control reference current to said ring oscillator means include current mirror field effect transistors (FETs) and a pair of field effect transistors (FETs) coupled to said current mirror FETs enabled for supplying said base range control reference current.

7. A phase locked loop (PLL) circuit as recited in claim 6 wherein said range control reference current means coupled to said ring oscillator means for applying said range control reference current to said ring oscillator means include a plurality of additional pairs of field effect transistors (FETs) coupled to said current mirror FETs, each additional pair selectively enabled by range control for supplying an incremental current added to said base range control reference.

8. A phase locked loop (PLL) circuit as recited in claim 1 wherein said range control includes at least two control signal outputs for operatively controlling said range control reference current means.

9. A phase locked loop (PLL) circuit as recited in claim 1 wherein said ring oscillator means for providing said output frequency signal includes a series of three differential buffers connected in a loop.

10. A phase locked loop (PLL) circuit as recited in claim 9 wherein both said variable reference current and said range control reference current is applied to each of said three differential buffers.

11. A phase locked loop (PLL) circuit as recited in claim 1 wherein said voltage to current means coupled to said ring oscillator means for converting control voltages to said variable reference current, and said range control reference current means coupled to said ring oscillator means for applying said range control reference current to said ring oscillator means include current mirror field effect transistors (FETs) connected to at least one reference current source.

* * * * *